United States Patent [19]

Graciotti et al.

[11] Patent Number: 4,903,302

[45] Date of Patent: Feb. 20, 1990

[54] ARRANGEMENT FOR CONTROLLING THE AMPLITUDE OF AN ELECTRIC SIGNAL FOR A DIGITAL ELECTRONIC APPARATUS AND CORRESPONDING METHOD OF CONTROL

[75] Inventors: Alessandro Graciotti, Ivrea; Massimo Bertagna, Samone, both of Italy

[73] Assignee: Ing. C. Olivetti & C., S.p.A., Ivrea, Italy

[21] Appl. No.: 231,453

[22] Filed: Aug. 12, 1988

[30] Foreign Application Priority Data

Feb. 5, 1988 [IT] Italy ............................... 67078 A/88

[51] Int. Cl.⁴ ................................................ G10L 5/00
[52] U.S. Cl. ......................................... 381/31; 381/30; 375/22
[58] Field of Search .................... 381/30, 31; 455/108; 375/22; 332/9 R

[56] References Cited

U.S. PATENT DOCUMENTS 4,270,027 5/1981 Agrawal et al. ...................... 381/31
4,754,466 6/1988 McCambridge ...................... 375/22
4,776,036 10/1988 Hulsey et al. ...................... 455/108

Primary Examiner—Emanuel S. Kemeny
Attorney, Agent, or Firm—Banner, Birch, McKie & Beckett

[57] ABSTRACT

In a digital system for amplitude modulation, the logical signal at acoustic frequency is modulated by means of an ultrasonic frequency signal, the duty-cycle of which can be varied by means of a program. More particularly, the modulating signal is generated by a cyclic counter. The duty-cycle is programmed by writing the corresponding numerical value to a register with a capacity equal to that of the counter. An adder, adding the value of the counter each time to that of the register, generates a carry signal which gives consent to the acoustic signal only for a part of the relative cycle of the modulating signal.

10 Claims, 2 Drawing Sheets

ARRANGEMENT FOR CONTROLLING THE AMPLITUDE OF AN ELECTRIC SIGNAL FOR A DIGITAL ELECTRONIC APPARATUS AND CORRESPONDING METHOD OF CONTROL

BACKGROUND OF THE INVENTION

The present invention relates to an arrangement for controlling the amplitude of an electric signal for a digital electronic apparatus, comprising a generator of a first logical signal of constant amplitude and of a frequency comprised within a predetermined frequency band, and a utilizing device sensitive to the amplitude of the signal.

This invention also relates to a method of controlling the amplitude of an electric signal in a digital environment, wherein a first logical signal is generated at constant amplitude and at low frequency.

More particularly, the invention relates to the control of the volume of an acoustic signalling device used in a digital desk-top apparatus for office use, such as a personal computer, a data processing work station or a telephone exchange.

As is known, modern digital desk-top apparatus includes sound generating circuitry which is able, under the control of a processor, to generate electric signals of any form, periodical or not, which are then translated into acoustic signals by a loudspeaker. Many application programs in the field of computers utilize the capacity to generate and disseminate sounds, whether as a simple signal attracting the attention of the operator in accordance with the program being executed, or for generating musical themes or tunes, or for synthesizing words and phrases of human speech.

For the purpose of adapting the volume of the sound to given surroundings or requirements, it has already been proposed to effect "static adjustment" of the volume of the sound by means of a device adjustable from time to time by a manupulation performed by the operator. Normally, such adjustment is effected by connecting in the circuit a potentiometer accessible to the operator and adapted to cut down the electric power carried to the loudspeaker, so that the command is of analog type.

However, these known adjusting devices have the disadvantage of not allowing integration with the digital circuits both of the computer and of the acoustic signals generator. Moreover, these adjusting devices do not allow ready automatic or programmed actuation for achieving "dynamic adjustment" of the volume, as may be required, for example, in line with processing results or the background noise of the environment, or, in the case of a text-to-speech translator, for introducing an expressive modulation or a modulation of inflexion of the sound in accordance with the context of the talk.

SUMMARY OF THE INVENTION

The technical problem of the present invention consists in producing a device for adjusting an electric signal in a digital environment which allows high integration of the adjusting circuit with the acoustic signals generator and allows automatic control by the processor.

This technical problem is solved by the arrangement according to the invention, which comprises a generator of a second logical signal with a frequency much greater than the frequencies of the band of the generator of the first logical signal, a digital circuit for varying the mark - space ratio (duty-cycle) or the second signal, and a circuit for modulating the first signal according to the second signal so as to reduce the mean value of the first signal correspondingly.

This problem is also solved by the method of controlling the amplitude of the electrical signal according to the invention which comprises the following steps: a second logical signal is generated at a frequency much greater than the frequency of the first logical signal, the mark - space ratio of the second signal is determined selectively, and the first signal is modulated with the second signal, whereby the mean value of the first signal is reduced correspondingly.

BRIEF DESCRIPTION OF THE DRAWINGS

These characteristics and other characteristics of the invention will appear more clearly from the following description of a preferred embodiment, given by way of example, but non-limitatively, with the aid of the accompanying drawings, in which.

DESCRIPTION OF THE PREFERRED EMBODIMENT

Figure 1:
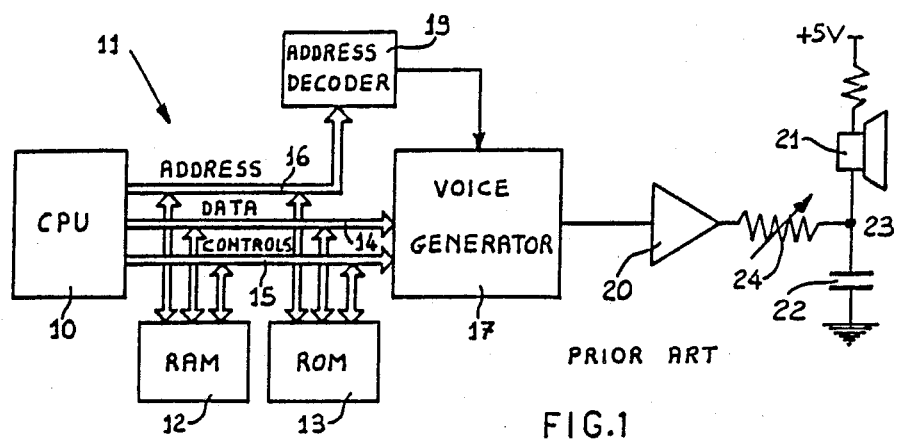
FIG. 1 is a basic circuit diagram of a digital apparatus incorporating a logical signals generator, according to the present state of the art.

Referring to FIG. 1, the reference 10 indicates the usual microprocessor (CPU), which constitutes the central unit of a personal computer indicated generally by the reference 11. The CPU 10 is connected to an operative memory or RAM 12 for data and programs and to a read-only memory or ROM 13 for programs through the medium of a bus comprising a data section 14, a controls section 15 and an address section 16. The personal computer 11 is moreover provided with a sound generator 17, which comprises a circuitry generating a square logical signal 18 (FIG. 2) of constant amplitude (+5 V) and of an acoustic frequency comprised, for example, between 10 and 20 KHz. The generator 17 (FIG. 1) is connected to the CPU 10 through the data section 14 and the controls section 15 of the bus, while it is connected through a decoder 19 to the address section 16 of the bus.

Figure 2:
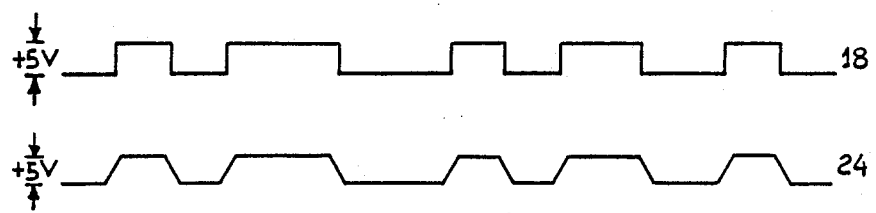
FIG. 2 is a diagram of some signals generated by the circuit of FIG. 1.

The generator 17 generates the square signal 18 (FIG. 2) selectively as a function of the data and controls received and modulates the frequency thereof as a function of the address received through the decoder 19 (FIG. 1). More particularly, the generator 17 may be constituted by a speech synthesizer, in such manner as to emit logical signals adapted to generate the desired words acoustically. The signal generated by the generator 17 is amplified by an amplifier 20 of the open collector (open collector driver) type and feeds a loudspeaker 21 connected between a voltage source at +5 V and a capacitor 22. This has the function of levelling the signal 18 at the node 23, whereby the loudspeaker 21 receives a trapezoidal signal 18A (FIG. 2).

According to the present state of the art, for the purpose of varying the amplitude or volume of the acoustic signal, between the amplifier 20 (FIG. 1) and the node 23 there is disposed a potentiometer 24 which can be actuated manually by the operator through a knob, for example disposed on the keyboard of the computer. This variation can therefore be commanded only from time to time and by an analog process.

According to the invention, on the other hand, the variation in the amplitude of the acoustic signal is modulated by means of a modulating logical signal which has a frequency much greater than the signal at acoustic frequency. The mark - space ratio (duty-cycle) of the modulating signal is varied selectively by a purely digital process.

Figure 3:
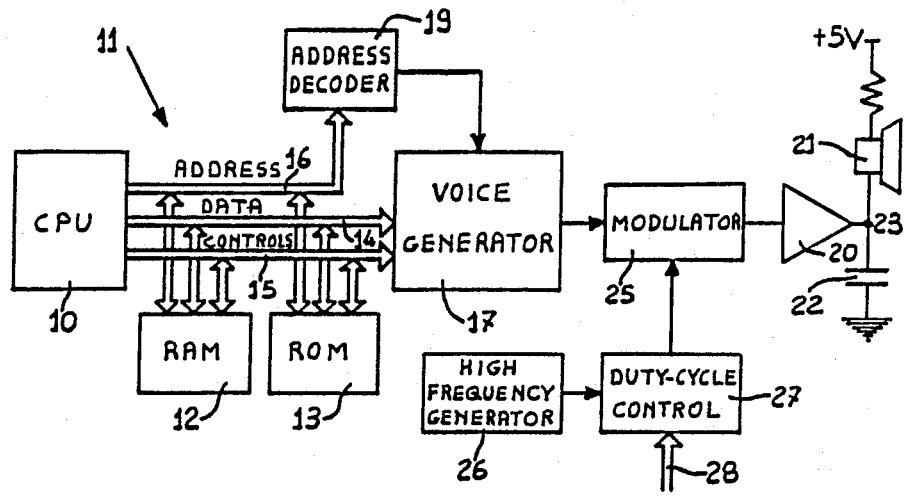
FIG. 3 is a basic circuit diagram of the apparatus of FIG. 1 in which is connected the arrangement according to the invention for controlling the amplitude of the signal.

To this end, between the generator 17 and the amplifier 20 there is disposed a modulating circuit 25 (FIG. 3) which is controlled by a generator 26 of a high-frequency or ultrasonic signal (much greater than 20 KHz, which represents the higher acoustic frequency). For example, the generator 26 can generate a frequency of 1 MHz, therefore from 50 to 100 times the frequency generated by the generator 17.

Between the generator 26 and the modulator 25 there is disposed a circuit 27 for varying the mark-space ratio or duty-cycle of the signal. The circuit 27 is controlled purely digitally through a bus 28 from the CPU 10.

Figure 4:
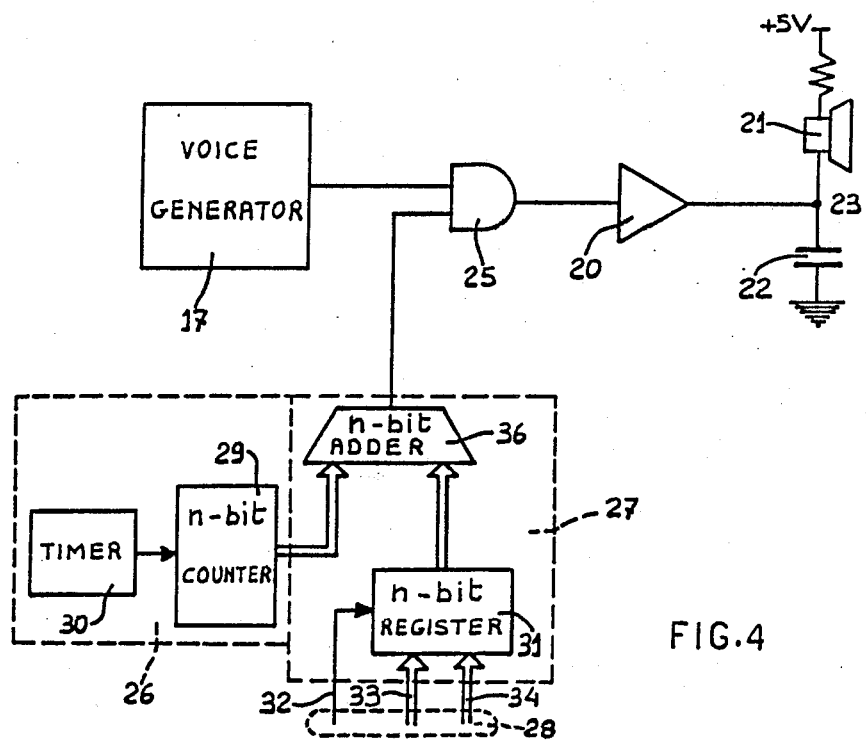
FIG. 4 is a detailed diagram of the control arrangement of FIG. 3.

More particularly, the modulator 25 is constituted by an AND coincidence circuit (FIG. 4), at an input of which arrives the logical signal at acoustic frequency emitted by the generator 17. In its turn, the generator 26 is constituted essentially by an n-bit counter 29, where n may be chosen, for example, equal to 4, so that the counter 29 is adapted to count from 0 to 15. The counter 29 is incremented by the usual timer 30 of the CPU 10, for example a 16 MHz timer, the frequency of the timer being a common multiple of the acoustic frequencies emitted by the generator 17.

The circuit 27 comprises essentially a register 31, also of n bits, which is loaded, or written to, each time with a value comprised between 0 and $2^n - 1$, corresponding to a certain mark-space ratio. More particularly, the register 31 is enabled for writing through the conductor 32 of the bus 28 under the control of the CPU 10. The required value is written to it through a data section 33 and a controls section 34 of the bus 28 according to the programming effected for this variation function.

The circuit 27 moreover comprises an adder 36, also of n bits, which is adapted to add the contents of the register 31 each time to the contents of the counter 29. Whenever this sum is $\geq 2^n$, the adder 36 emits a carry, thus generating a consent signal for the second input of the coincidence circuit 25. The latter therefore causes the logical signal at acoustic frequency to pass only in correspondence with the fraction of the counting period of the counter 27 in which the adder 36 emits "carry". The capacitor 22 provides for producing the mean value of the signal being input to the loudspeaker 21.

Figure 5:
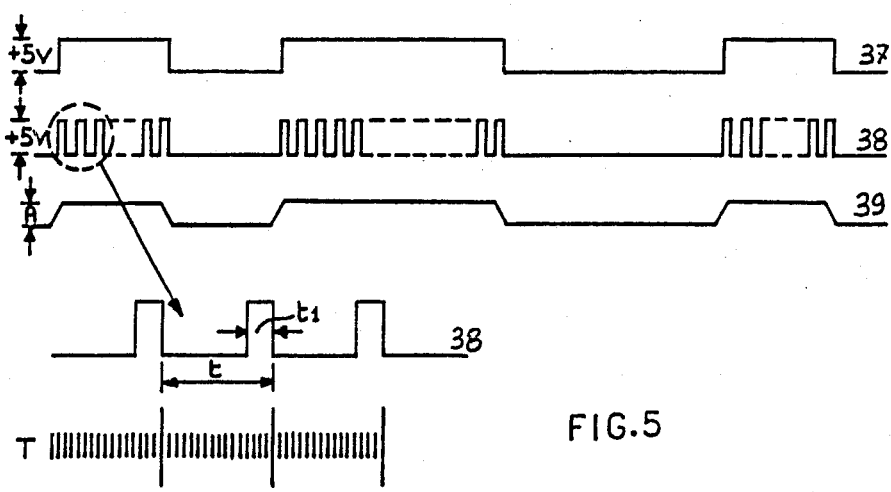
FIG. 5 shows some signals generated by the arrangement of FIG. 4.

In FIG. 5 there is shown the acoustic signal 37 with a scale of times much greater than that of FIG. 2. The diagram 38, on the other hand, shows the high-frequency and variable duty-cycle signal emitted by the adder 36. It is therefore clear that during each signal 37 there is generated a plurality of high-frequency signals 38. FIG. 5 moreover shows in detail the signal 38 in relation to the pulses T of the timer 30 for the case of n=4.

The duty-cycle of the signal 38 is represented by the ratio $t_1/t$. It is clear that, for a value 0 written to the register 31, we have $t_1/t=0$, which corresponds to the turning off of the loudspeaker 21, while for a value of the register 31 of $2^n - 1$ we have $t_1/t=1$, which corresponds to the maximum volume of the loudspeaker 21.

It is to be noted that the loudspeaker 21 will not reproduce the modulating signal, since this has a frequency which is too high and therefore ultrasonic, while the capacitor 22 provides for levelling the effect thereof. The acoustic signal 39 which drives the loudspeaker 21 has an amplitude $A=5$ V $t_1/t$. It therefore has a waveform like the acoustic signal 37 upstream of the modulation, but an amplitude proportional to the mark-space ratio or duty-cycle of the modulating signal.

It is clear that the control arrangement described and the corresponding method allow adjustment of the sound volume, both static and dynamic, in a very flexible and programmable manner. The value written from time to time to the register 31 may depend either on the results of the processing of the data, or on the background noise of the environment, measured by a suitable measuring device, or on the context itself of a text-to-speech translator in apparatus in which the acoustic signal is generated by this translator.

It is moreover clear that the control arrangement described may be applied to various kinds of office equipment, such as data processing work stations, or telephone exchanges for local networks, or to spoken announcement systems in public places.

Finally, it is clear that the control arrangement, being based on digital technique, allows high integration with the digital circuits of the apparatus in which it is incorporated and, in particular, with the circuits of personal computers or of exchanges for local networks.

It is understood that various modifications and improvements may be made in the arrangement described without departing from the scope of the invention.

What we claim is:

1. An arrangement for controlling the amplitude of an electric signal for a digital electronic apparatus, comprising a generator of a first logical signal of constant amplitude and of a frequency comprised within a predetermined frequency band, and a utilizing device sensitive to the amplitude of said signal, wherein said first logical signal defines a mark-space ratio and a main value, and wherein said arrangement further comprises a generator of a second logical signal with a frequency much greater than the frequencies of said band, a digital circuit for varying the mark-space ratio (duty-cycle) of said second signal, and a circuit for modulating said first logical signal according to said second signal so as to reduce the mean value of said first signal correspondingly.

2. Arrangement as in claim 1, wherein said digital circuit comprises a counter of predetermined capacity containing a digital value and which is driven at a base frequency much greater than the frequency of said second signal, a register adapted to be set variably to define an entering digital value and an adder adapted to add up the digital value entered in said register with the digital value contained each time in said counter and providing a carry, said mark-space ratio being defined by the carry of said adder.

3. Arrangement as in claim 2, wherein said register and said adder have the same capacity as the said counter.

4. Arrangement as in claim 3, wherein said modulating circuit further comprises a coincidence logic circuit and said utilizing device comprises a capacitive circuit adapted to level the variations in said second signal during the emission of said first signal.

5. Arrangement as in claim 4, wherein said base frequency is at least 50 times greater than the maximum frequency of said band, said capacity being at least half a byte.

6. Arrangement as in claim 1, wherein the generator of said first signal is a generator of a square signal of acoustic frequencies and said utilizing device comprises a loudspeaker.

7. Arrangement as in claim 6, wherein said arrangement is incorporated in a personal computer having a central unit and storing a programs said register being set from the central unit of the computer in accordance with the corresponding program.

8. Arrangement as in claim 7, wherein the generator of said first signal comprises a voice synthesizer or a text-to-speech translator which is controlled by said counter being driven by the timer of said computer.

9. A method of controlling the amplitude of an electric signal in a digital environment, wherein a first logical signal defining a mean value is generated at constant amplitude and at low frequency, and comprising the following steps: a second logical signal defining a mark-space ratio is generated at a frequency much greater than the frequency of the first signal, the mark-space ratio of said second signal is determined selectively, and said first signal is modulated with said second signal, whereby the mean value of said first signal is reduced correspondingly.

10. Method as in claim 9, wherein said mark-space ratio is defined by adding to a predetermined decimal value a count value of a base timing frequency much greater than the frequency of the second signal.

* * * * *